(12) United States Patent
Zhang et al.

(10) Patent No.: US 12,213,341 B2
(45) Date of Patent: Jan. 28, 2025

(54) DISPLAY PANEL AND DISPLAY APPARATUS FOR IMPROVED DISPLAY UNIFORMITY

(71) Applicant: KunShan Go-Visionox Opto-Electronics Co., Ltd, Jiangsu (CN)

(72) Inventors: Lu Zhang, Kunshan (CN); Yanqin Song, Kunshan (CN); Chuanzhi Xu, Kunshan (CN); Siming Hu, Kunshan (CN); Zhenzhen Han, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 297 days.

(21) Appl. No.: 17/713,571

(22) Filed: Apr. 5, 2022

(65) Prior Publication Data

US 2022/0231093 A1 Jul. 21, 2022

Related U.S. Application Data

(63) Continuation of application No. PCT/CN2021/082771, filed on Mar. 24, 2021.

(30) Foreign Application Priority Data

Apr. 17, 2020 (CN) .......................... 202010307757.0

(51) Int. Cl.
*H10K 59/121* (2023.01)
*H10K 59/65* (2023.01)

(52) U.S. Cl.
CPC ........... *H10K 59/121* (2023.02); *H10K 59/65* (2023.02)

(58) Field of Classification Search
None
See application file for complete search history.

(56) References Cited

U.S. PATENT DOCUMENTS

| 2004/0183435 A1 | 9/2004 | Ohshita |
|---|---|---|
| 2021/0066409 A1 | 3/2021 | Fan |

(Continued)

FOREIGN PATENT DOCUMENTS

| CN | 104821329 A | 8/2015 |
|---|---|---|
| CN | 102566175 B | 4/2016 |

(Continued)

OTHER PUBLICATIONS

Office Action issued on May 9, 2023, in corresponding Japanese Application No. 2022-528706, 8 pages.

(Continued)

*Primary Examiner* — Suberr L Chi
(74) *Attorney, Agent, or Firm* — Maier & Maier, PLLC (57) ABSTRACT

A display panel and a display apparatus. The display panel includes a first display area, a second display area, and a transitional display area located between the first display area and the second display area. A light transmittance of the first display area is greater than that of the second display area. The display panel includes: a plurality of first sub-pixels arranged in the first display area; a plurality of second sub-pixels arranged in the transitional display area; a plurality of first pixel driving circuits arranged in the transitional display area and configured to drive the first sub-pixels and the second sub-pixels; a plurality of blocks arranged in the first display area and corresponding to at least a part of the plurality of first sub-pixels.

18 Claims, 6 Drawing Sheets

(56) References Cited

U.S. PATENT DOCUMENTS

| | | |
|---|---|---|
| 2021/0351255 A1 | 11/2021 | Chang et al. |
| 2022/0036795 A1 | 2/2022 | Lou et al. |
| 2022/0069023 A1 | 3/2022 | Lou et al. |

FOREIGN PATENT DOCUMENTS

| | | | |
|---|---|---|---|
| CN | 107819018 | A | 3/2018 |
| CN | 107994054 | A | 5/2018 |
| CN | 109801950 | A | 5/2019 |
| CN | 110061038 | A | 7/2019 |
| CN | 110189639 | A | 8/2019 |
| CN | 110504289 | A | 11/2019 |
| CN | 110690254 | A | 1/2020 |
| CN | 110783384 | A | 2/2020 |
| CN | 110783386 | A | 2/2020 |
| CN | 210245501 | U | 4/2020 |
| CN | 111834413 | A | 10/2020 |
| WO | 2019171198 | A1 | 9/2019 |
| WO | 2019242351 | A1 | 12/2019 |

OTHER PUBLICATIONS

Reexamination Decision issued on Nov. 22, 2022, in corresponding Chinese Application No. 2020103077570, 10 pages, with partial English translation.

Extended European Search Report issued on Sep. 5, 2023, in corresponding European Application No. 21788253.9, 10 pages.

The Notification of Reexamination issued on Aug. 24, 2022, in connection with corresponding Chinese Application No. 202010307757.0 (7 pages, including partial English translation).

The International search report for PCT Application No. PCT/CN2021/082771, dated Jun. 18, 2021, 11 pages.

The First Office Action for CN Application No. 202010307757.0, dated Oct. 25, 2021, 8 pages.

The Rejection Decision for CN Application No. 202010307757.0, dated Feb. 11, 2022, 5 pages.

Decision to Grant issued on Aug. 1, 2023, in corresponding Japanese Application No. 2022-528706, 5 pages.

Search Report issued on Apr. 6, 2023, in corresponding Japanese Application No. 2022-528706, 25 pages.

Office Action issued on Apr. 18, 2024, in corresponding Korean Application No. 10-2022-7015188, 21 pages.

DISPLAY PANEL AND DISPLAY APPARATUS FOR IMPROVED DISPLAY UNIFORMITY

CROSS-REFERENCE TO RELATED APPLICATIONS

This application is a continuation of International Application No. PCT/CN2021/082771, filed on Mar. 24, 2021, which claims priority to Chinese Patent Application No. 202010307757.0, filed on Apr. 17, 2020, both of which are hereby incorporated by reference in their entireties.

TECHNICAL FIELD

The present application relates to the field of display technology, and in particular to a display panel and a display apparatus.

BACKGROUND

With the rapid development of electronic devices, the requirements of users on screen-to-body proportions become higher and higher. Thus, full-screen electronic devices are receiving more and more attention in the industry.

Electronic devices such as cell phones, tablets and the like need to integrate components such as front cameras, earpieces, and infrared sensing elements, and thus the light transmittance of the corresponding areas need to be increased. For this reason, more and more manufacturers have improved a structure of a display panel of the electronic device corresponding to the components such as the front cameras, which can meet the photosensitive requirements of the front camera and other components to a certain extent, but make the display panels have defects of non-uniform display.

Therefore, there is a need for a new display panel and a new display apparatus.

SUMMARY

Embodiments of the present application provide a display panel and a display apparatus, which can meet the photosensitive requirements of devices such as a front camera and can improve display uniformity of the display panel at the same time.

In an aspect, the embodiments of the present application provide a display panel including a first display area, a second display area, and a transitional display area located between the first display area and the second display area, a light transmittance of the first display area being greater than a light transmittance of the second display area, wherein the display panel includes: a plurality of first sub-pixels arranged in the first display area; a plurality of second sub-pixels arranged in the transitional display area; a plurality of first pixel driving circuits arranged in the transitional display area and configured to drive the first sub-pixels and the second sub-pixels; a plurality of blocks arranged in the first display area and corresponding to at least a part of the plurality of first sub-pixels.

In another aspect, the embodiments of the present application provide a display apparatus including the display panel described above.

According to the display panel and the display apparatus provided in the embodiments of the present application, the display panel has the first display area, the second display area and the transitional display area located between the first display area and the second display area. The light transmittance of the first display area is greater than the light transmittance of the second display area. In actual practice, components such as a front camera can be arranged under the first display area, so that not only the full-screen display requirements of the display panel can be satisfied, but also the photosensitive requirements of the components such as the camera arranged under the first display area can be satisfied because the greater light transmittance of the first display region.

The display panel includes the first sub-pixels and the blocks located in the first display area as well as the second sub-pixels and the first pixel driving circuits located in the transitional display area. Therefore, the first sub-pixels located in the first display area and the second sub-pixels located in the transitional display area can be driven through the first pixel driving circuits, and at the same time, the distribution pattern of the blocks arranged in the first display area can be made similar to the distribution pattern of the first pixel driving circuits arranged in the transitional display area due to the arrangement of the blocks. The uniformity of the distribution pattern of the first pixel driving circuits arranged in the transitional display area which is adjacent to the first display area is improved, thereby ensuring the display uniformity of the display panel.

BRIEF DESCRIPTION OF THE DRAWINGS

Features, advantages, and technical effects of an exemplary embodiments of the present application will be described below with reference to the accompanying drawings.

DETAILED DESCRIPTION

Features of various aspects and exemplary embodiments of the present application will be described in detail below. In order to make the objectives, technical solutions, and advantages of the present application clearer, the present application will be further described in detail below with reference to the drawings and specific embodiments. It should be understood that, the specific embodiments described herein are only configured for explaining the present application, and not configured for limiting the present application. For those skilled in the art, the present application can be implemented without some of those specific details. The following description of the embodiment is only for providing a better understanding of the present application by showing examples of the present application.

It is to be noted that relational terms such as first, second, and the like are used herein solely to distinguish one entity or operation from another entity or operation without necessarily requiring or implying any actual such relationship or order between such entities or operations. Moreover, the terms "include", "including", or any other variation thereof, are intended to cover a non-exclusive inclusion, such that a process, method, article or device that includes a series of elements does not include only those elements but may include other elements not explicitly listed or inherent to such process, method, article or device. An element preceded by "include . . . " does not, without more constraints, preclude the existence of additional identical elements in the process, method, article or device that includes the element.

It will be understood that, in describing the structure of a component, when one layer or one region is referred to as being "on" or "above" another layer or another region, it means that the one layer or the one region is directly on the another layer or another region, or there are other layers or regions between the one layer or the one region and the another layer or the another region. In addition, if the component is turned upside-down, the one layer or the one region will be "under" or "below" the another layer or the another region.

In electronic devices such as mobile phones and tablets, photosensitive components (e.g., front cameras, infrared light sensors, and proximity light sensors) are required to be integrated on a side where a display panel is provided. In some embodiments, light-transmitting display areas may be provided on the above-mentioned electronic devices, and the photosensitive components may be arranged on the back of the light-transmitting display areas, so that full-screen display of the electronic devices can be realized with the normal operation of the photosensitive components being ensured.

In order to reduce the amount of wiring in the light-transmitting display area, the pixel driving circuits corresponding to the light-transmitting display area are usually arranged in a transitional display area located at the periphery of the light-transmitting display area. However, as the pixel structure or wiring position of the light-transmitting display area changes, there will be an edge effect in the manufacture process of the display panel, which is mainly embodied in that the pattern and characteristics of the pixel driving circuits of the transitional display area adjacent to the edge of the light-transmitting display area are different from those of the pixel driving circuits in other areas, causing non-uniform display.

Therefore, in order to solve the above-mentioned technical problems, the embodiments of the present application provide a display panel and a display apparatus. The display panel and the display apparatus in the embodiments of the present application are described in detail below with reference to FIG. 1 to FIG. 8.

Figure 1:
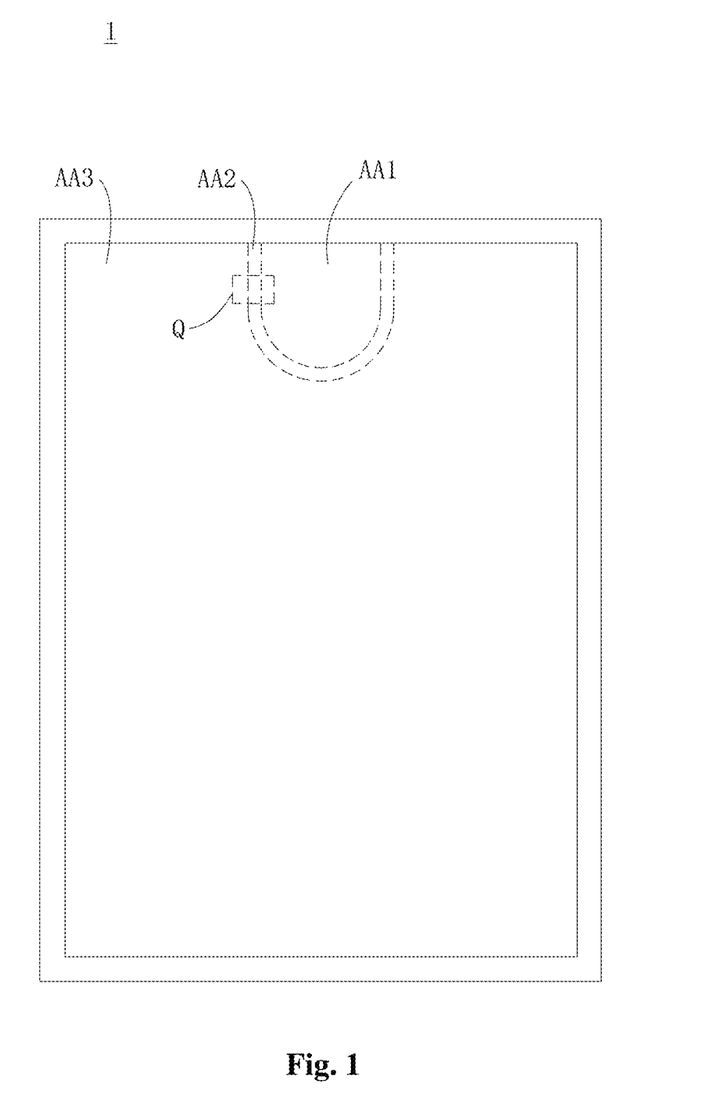
FIG. 1 is a schematic structural diagram of a top view of a display panel according to an embodiment of the present application.
Figure 3:
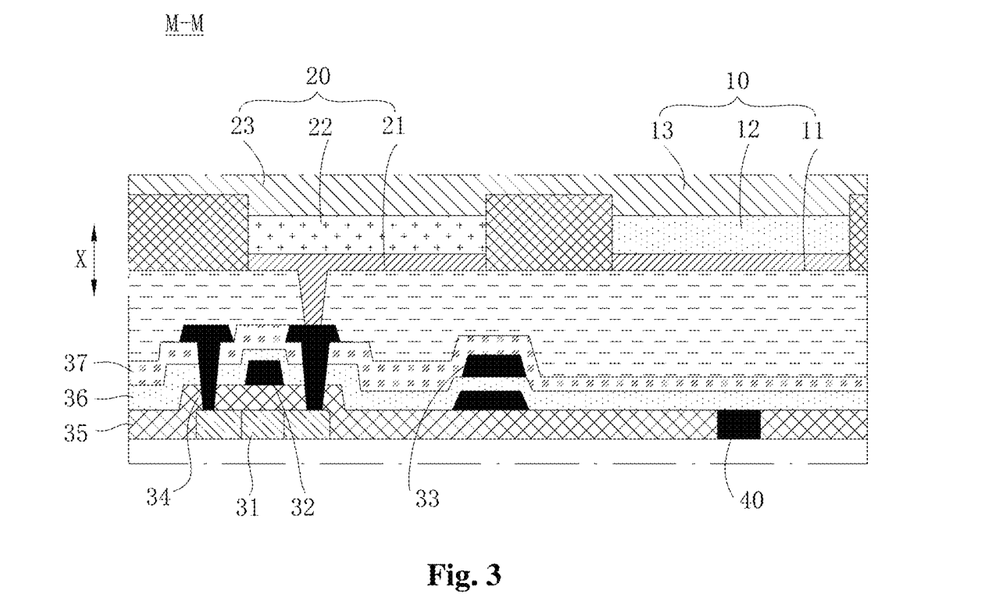
FIG. 3 is a schematic structural diagram of a cross-sectional view along the direction M-M in FIG. 2.

As shown in FIG. 1 and FIG. 3, the embodiments of the present application provide a display panel 1. The display panel 1 may be an organic light emitting diode (OLED) display panel.

The display panel 1 has a first display area AA1, a second display area AA3, and a transitional display area AA2 located between the first display area AA1 and the second display area AA3. A light transmittance of the first display area AA1 is greater than a light transmittance of the second display area AA3.

Optionally, the light transmittance of the first display area AA1 is greater than or equal to 15%, or even greater than 40%, or even higher. For this reason, in one or more embodiments of the present application, the light transmittance of each of functional film layers of the display panel 1 is greater than 80%, and the light transmittance of at least some of the functional film layers is even greater than 90%.

According to the embodiments of the present application, the light transmittance of the first display area AA1 of the display panel 1 is greater than the light transmittance of the second display area AA3, so that in the display panel 1, photosensitive components can be integrated on the back side of the first display area AA1, achieving the under-screen integration of a photosensitive component 2 such as a camera. At the same time, the first display area AA1 can display images, which increases the display area of the display panel 1 and realizes a full-screen design of the display apparatus.

Figure 2:
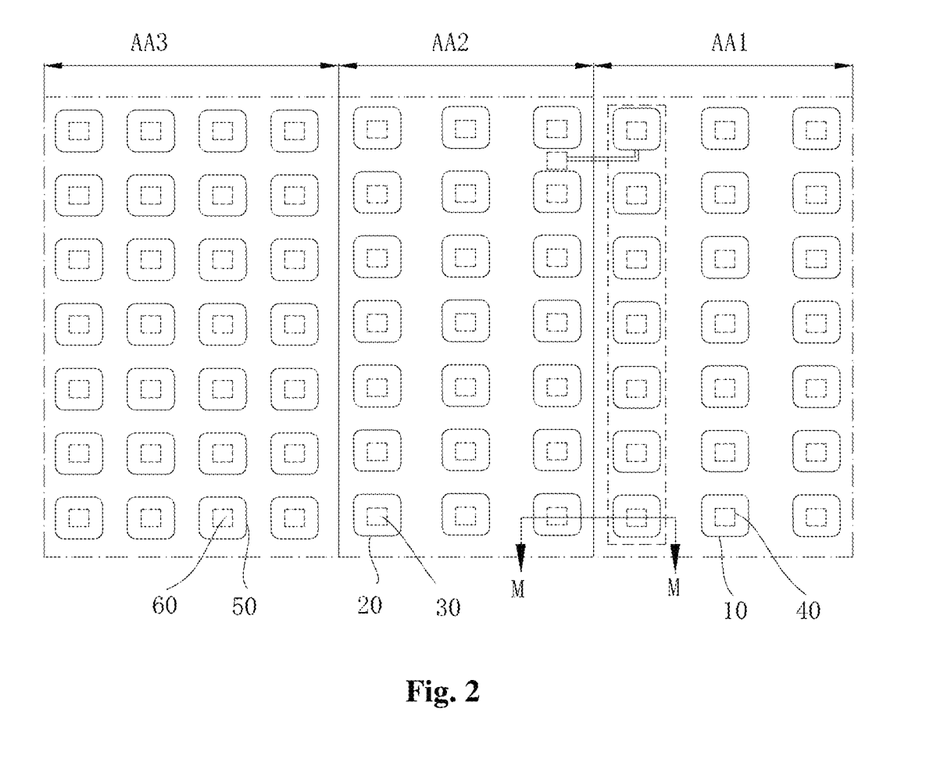
FIG. 2 is a schematic partial enlarged view of the region Q in FIG. 1.

In an optional implementation, the display panel 1 includes a plurality of first sub-pixels 10, a plurality of second sub-pixels 20, a plurality of first pixel driving circuits 30, and a plurality of blocks 40. The plurality of first sub-pixels 10 are arranged in the first display area AA1, and the plurality of second sub-pixels 20 are arranged in the transitional display area AA2. The plurality of first pixel driving circuits 30 are arranged in the transitional display area AA2 and configured to drive the first sub-pixels 10 and the second sub-pixels 20. The plurality of blocks 40 are arranged in the first display area AA1 and corresponding to at least a part of the plurality of first sub-pixels 10.

In the display panel 1 according to the embodiments of the present application, the first pixel driving circuits 30 are arranged in the transitional display area AA2 and configured to control the first sub-pixels 10 and the second sub-pixels 20, so that the display functions of the first sub-pixels 10 and the second sub-pixels 20 can be effectively ensured. In addition, the wiring in the first display area AA1 can be reduced and the light transmittance of the first display area AA1 can be improved, so that the requirements for under-screen integration of the components such as cameras can be satisfied. Further, the blocks 40 arranged in the first display area AA1 make the distribution pattern (or in other words, the distribution pattern of the devices) in the first display area AA1 be similar to the distribution pattern of the first pixel driving circuits 30 arranged in the transitional display area AA2, which improves the uniformity of the pattern of the first pixel driving circuits 30 in the transitional display area AA2 adjacent to the first display area AA1, thereby improving the display uniformity of the display panel 1.

In some optional embodiments, the plurality of first pixel driving circuits 30 of the display panel are distributed in a first density. The plurality of blocks 40 are distributed in a second density. The first density is equal to or greater than the second density. With the above arrangement, it can be ensured that the density of the distribution pattern of the first pixel driving circuits 30 located in the transitional display area AA2 tends to be consistent with the density of the distribution pattern in other areas (especially the first display area AA1), which improves the uniformity of the distribution pattern of the first pixel driving circuits 30 and ensures good display effect.

In an optional implementation, in the display panel 1 according to the embodiments of the present application, each of the first sub-pixels 10 adjacent to the plurality of second sub-pixels 20 in the transitional display area AA2 corresponds to at least one block 40. Since the first pixel driving circuits 30 configured to drive the first sub-pixels 10 in the first display area AA1 are arranged in the transitional display area AA2, edge effects are likely to occur at the edge of the transitional display area AA2 close to the first display area AA1. Therefore, by making each of the first sub-pixels 10 adjacent to the second sub-pixels 20 in the transitional display area AA2 correspond to at least one block 40, the difference between the distribution pattern of the first pixel driving circuits 30 in the transitional display area AA2 and the distribution pattern in the first display area AA1 which is adjacent to the transitional display area AA2 can be effectively reduced, thereby optimizing the edge effect occurring in the transitional display area AA2 and ensuring good display effect.

It should be noted that, each of the first sub-pixels 10 adjacent to the second sub-pixels 20 in the transitional display area AA2 as mentioned in the above embodiments refers to all first sub-pixels 10 arranged directly on one side of the second sub-pixels 20 without other sub-pixels being arranged between the first sub-pixel 10 and the second sub-pixels 20.

For example, as shown in FIG. 2, a column of first sub-pixels 10 within a dotted line box are arranged on one side of corresponding second sub-pixels 20, and there is no other sub-pixels being arranged between the column of first sub-pixels 10 and the corresponding second sub-pixels 20. The column of first sub-pixels 10 are arranged adjacent to the second sub-pixels 20 in the transitional display area AA2 and each of the first sub-pixels 10 is corresponding to at least one block 40. In addition, in order to be clear in the drawings, in FIG. 2, as an example, only one first sub-pixel 10 in the first display area AA1 is illustrated as being connected with the first pixel driving circuit 30 in the transitional display area AA2. The other first pixel driving circuits 30 configured to drive the first sub-pixels 10 may be arranged in the transitional display area AA2 according to specific requirements, the other first pixel driving circuits 30 may be located in a blank area between adjacent second sub-pixels 20 and may also be located below corresponding second sub-pixels 20, as long as the driving requirements can be satisfied. Not all arrangements of the first pixel driving circuits 30 are shown in the figures.

As shown in FIG. 2 and FIG. 3, in some optional embodiments, in the display panel 1 according to the embodiments of the present application, the number of the plurality of blocks 40 may be equal to the number of the plurality of the first sub-pixels 10, and the plurality of blocks 40 are arranged in a one-to-one correspondence with the plurality of the first sub-pixels 10. With the above arrangement, the difference between the distribution pattern of the first pixel driving circuits 30 in the transitional display area AA2 and the distribution pattern in the first display area AA1 which is adjacent to the transitional display area AA2 can be effectively reduced, which improves the uniformity of the distribution pattern of the first pixel driving circuits 30, and thus improves the uniformity of the characteristics of the first pixel driving circuits 30.

In an optional implementation, in the display panel 1 provided by the embodiments described above, each of the first sub-pixels 10 includes a first electrode 11, a first light-emitting element 12 located on the first electrode 11, and a second electrode 13 located on the first light-emitting element 12. The first electrode 11 is connected to the first pixel driving circuit 30. The first pixel driving circuit 30 can drive a connected first sub-pixel 10. In an arrangement direction X of the first electrode 11 and the second electrode 13, an orthographic projection of each block 40 is covered by an orthographic projection of the first electrode 11.

With the above arrangement, the reduction of the difference between the distribution pattern of the first pixel driving circuits 30 in the transitional display area AA2 and the distribution pattern of the adjacent area and the effective improvement of the uniformity of the pattern distribution of the first pixel driving circuits 30 can be ensured, and at the same time, the diffraction of light in the first display area AA1 will not be affected by the blocks 40. The light transmission requirements of first display area AA1 can be satisfied, and thus the photosensitive requirements of components such the front camera can be satisfied.

In an optional implementation, in the display panel 1 according to the embodiments of the present application, in the arrangement direction X of the first electrode 11 and the second electrode 13, the orthographic projection of each block 40 is completely covered by the orthographic projection of the corresponding first electrode 11.

In some optional embodiments, in the display panel 1 provided by the embodiments of the present application, each of the second sub-pixels 20 includes a third electrode 21, a second light-emitting element 22 located on the third electrode 21, and a fourth electrode 23 located on the second light-emitting element 22. The third electrode 21 is connected to the first pixel driving circuit 30. The first pixel driving circuit 30 can drive a connected second sub-pixel 20.

In some optional embodiments, the first electrode 11 and third electrode 21 are anodes, and the second electrode 13 and fourth electrode 23 are cathodes.

In an optional implementation, in order to reduce the number of first pixel driving circuits 30 and ensure that the light transmittance of the transitional display area AA2 is between that of the first display area AA1 and that of the second display area AA3, optionally, first electrodes 11 of the first sub-pixels 10 of a same color among the plurality of first sub-pixels 10 may be electrically interconnected and are driven by one first pixel driving circuit 30. Optionally, third electrodes 21 of the second sub-pixels 20 of a same color among the plurality of second sub-pixels 20 may be electrically interconnected and are driven by one first pixel driving circuit 30. With the above arrangement, the number of first pixel driving circuits 30 can be effectively reduced, and at the same time, the wiring in the first display area AA1 and the transitional display area AA2 can be reduced, thereby better ensuring that the requirements of the light transmittance of the first display area AA1 can be satisfied.

In some optional embodiments, in the display panel 1 provided by the embodiments of the present application, the blocks 40 may be made of a conductive material or a non-conductive material. Optionally, the blocks 40 may be made of a metallic material or a non-metallic material. Optionally, the blocks 40 may be a non-transparent structure, of which the shape may be set as desired, as long as the requirement that the difference between the distribution pattern of the first pixel driving circuits 30 in the transitional display area AA2 and the distribution pattern of the adjacent area being reduced can be better met.

In an optional implementation, in the display panel 1 provided by the above embodiments, the first pixel driving circuit 30 has a plurality of transistors and a plurality of capacitors. Optionally, the first pixel driving circuit 30 includes a semiconductor layer 31, a first metal layer 32, a second metal layer 33, a third metal layer 34 and an interlayer insulating layer. The blocks 40 are provided in a same layer as at least one of the semiconductor layer 31, the first metal layer 32, the second metal layer 33, the third metal layer 34 and the interlayer insulating layer. With the above arrangement, the molding of the block 40 can be facilitated, the molding process of the display panel 1 can be effectively simplified, and the influence on the driving and display performance of the display panel 1 can be avoided.

Optionally, the interlayer insulating layer includes a first interlayer insulation layer 35 (also referred to as a gate insulation layer), a second interlayer insulation layer 36 and a third interlayer insulation layer 37. The first interlayer insulation layer 35 is arranged as covering the semiconductor layer 31, the second interlayer insulation layer 36 is arranged as covering the first metal layer 32, and the third interlayer insulation layer 37 is arranged as covering the second metal layer 33.

In some optional embodiments, in the molding process of the display panel 1, the plurality of blocks 40 may be arranged in a same layer as the semiconductor layer 31. That is, when molding an active region of a transistor at a corresponding position of the transitional display area AA2, a structure consistent with the material of the active region may be simultaneously molded at a corresponding region of each first sub-pixel 10 in the first display area AA1, so as to form the block 40 mentioned in the above embodiments of the present application. Therefore, the molding requirements of the blocks 40 can be satisfied without additional a molding process for the display panel 1. Optionally, the shape of the block 40 can be consistent with the shape of the corresponding active region of the transistor.

Figure 4:
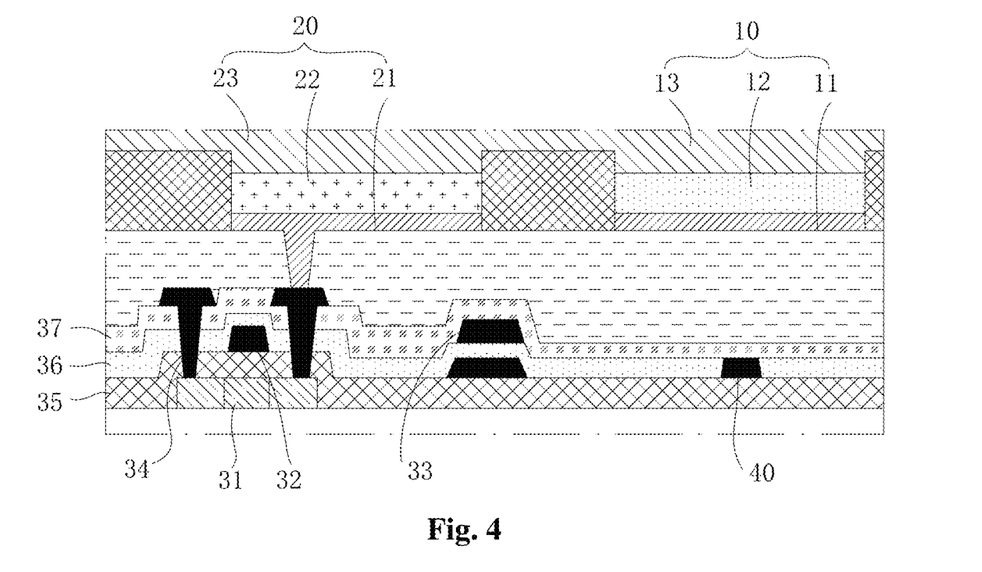
FIG. 4 is a schematic structural diagram of a partial cross-sectional view of a display panel according to another embodiment of the present application.

In some other embodiments, as shown in FIG. 4, in the molding process of the display panel 1, a plurality of blocks 40 may be arranged in a same layer as the first metal layer 32 of the first pixel driving circuit 30. That is, when molding the first metal layer 32 at a corresponding position of the transitional display area AA2, for example, when molding a gate electrode of the transistor, a structure consistent with the material of the gate electrode may be molded simultaneously in a corresponding area of each first sub-pixel 10 in the first display area AA1, so as to form the block 40 mentioned in the above embodiments of the present application. The molding requirements of the block 40 can be satisfied without additional molding process for the display panel 1. Optionally, the shape of the block 40 may be consistent with the shape of the corresponding gate electrode.

Figure 5:
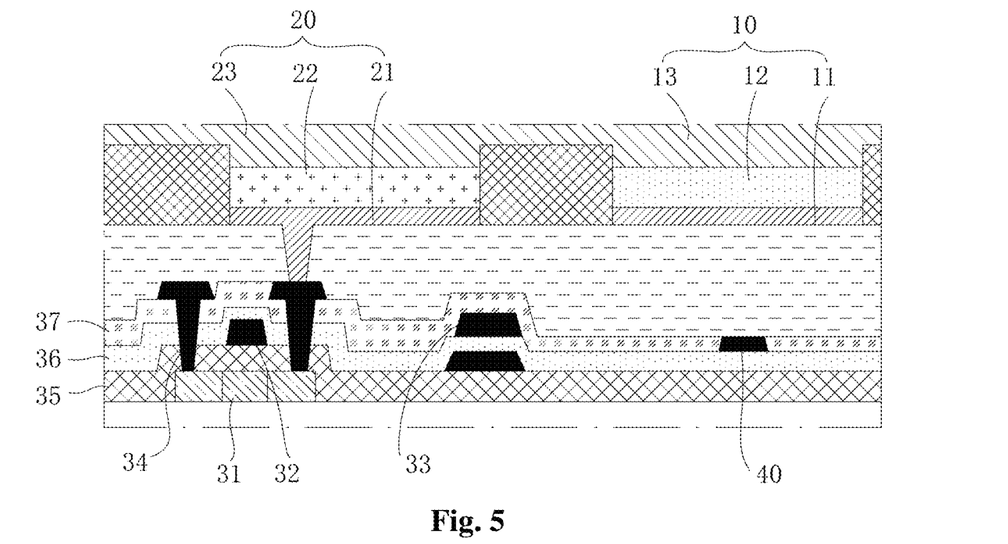
FIG. 5 is a schematic structural diagram of a partial cross-sectional view of a display panel according to yet another embodiment of the present application.

As shown in FIG. 5, in some other examples, in the molding process of the display panel 1, a plurality of blocks 40 may be arranged in a same layer as an inter-layer Dielectric (ILD). Optionally, the blocks 40 may be specifically arranged in a same layer as the first interlayer insulation layer 35, the second interlayer insulation layer 36, or the third interlayer insulation layer 37. For the ease of understanding, the blocks 40 are illustrated as being in the same layer as the third interlayer insulation layer 37. In the molding process of the display panel 1, after the third interlayer insulation layer 37 is molded in the first display area AA1, the transitional display area AA2 and the second display area AA3, a plurality of hole-shaped slots may be formed in the third interlayer insulation layer 37 located in the first display area AA1 by a process such as etching, and then the material is filled in the corresponding hole-shaped slots by a process such as evaporation and deposition, so as to mold the plurality of blocks 40. The requirements of the blocks 40 can also be met.

It will be appreciated that the above arrangements of the blocks 40 being in the same layer as the semiconductor layer 31, the first metal layer 32 or the third interlayer insulation layer 37 of the first pixel driving circuit 30 is illustrative for a better understanding of the display panel 1 provided by the embodiments of the present application, which are three optional embodiments, and the arrangements of the blocks 40 are not limited to the above embodiments. In some other examples, the plurality of blocks 40 may be arranged in the same layer as at least one of the second metal layer 33, the third metal layer 34, the first interlayer insulation layer 35 and the second interlayer insulation layer 36, which are not detailed herein. For example, the blocks may be arranged in the same layer as the first interlayer insulation layer 35, the second interlayer insulation layer 36 and the third interlayer insulation layer 37 at the same time, which also can meet the performance requirements of the display panel 1.

Figure 6:
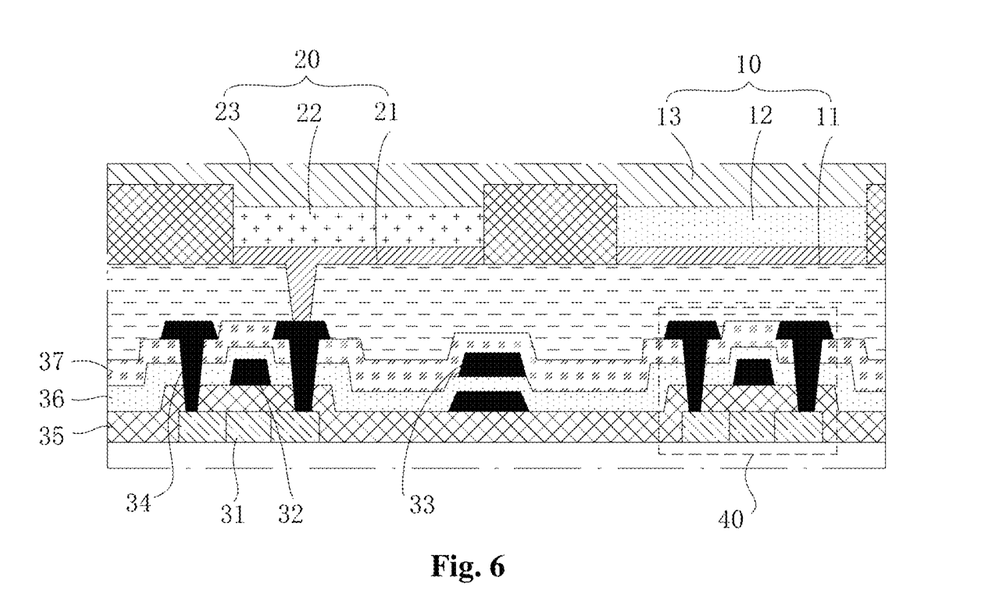
FIG. 6 is a schematic structural diagram of a partial cross-sectional view of a display panel according to yet another embodiment of the present application.

According to some embodiment of the present application, the plurality of blocks 40 being arranged in the same layer as the at least one layer of the first pixel driving circuit 30 are merely some optional implementations. As shown in FIG. 6, in still other examples, the structure of the block 40 may be made to be a transistor structure, for example, the structure of the block 40 may be the same as any transistor structure included in the first pixel driving circuit 30. This arrangement can also achieve the same effect, so that the density of the distribution pattern of the first pixel driving circuits 30 in the transitional display area AA2 which is adjacent to the edge of the first display area AA1 region is similar to the density of the distribution pattern in other regions, which can improve the uniformity of the distribution pattern of the first pixel driving circuits 30, and thus improve the characteristic uniformity of the first pixel driving circuits 30.

In an optional implementation, in the display panel 1 provided by the above embodiments, the plurality of blocks 40 are arranged in rows and columns. With the above arrangement, the uniformity of the characteristics of the first pixel driving circuits 30 can be improved. At the same time, the molding of the block 40 can be facilitated, and in an arrangement direction of the first electrode 11 and the second electrode 13, an orthographic projection of each of the blocks 40 can be easily covered by an orthographic projection of the first electrode 11 of the corresponding first sub-pixel 10, which reduces or avoids the influence of the block 40 on the light in the first display area AA1.

In an optional implementation, the display panel 1 provided by the above embodiments further includes a plurality of third sub-pixels 50 arranged in the second display area AA3. The plurality of third sub-pixels 50 are distributed in a third density. The plurality of first sub-pixels 10 are distributed in a fourth density. The third density is greater than the fourth density. With the above arrangement, the requirement of the light transmittance that the light transmittance of the first display area AA1 is greater than the light transmittance of the second display area AA3 can be better achieved.

In an optional implementation, as shown in FIG. 2 to FIG. 6, the display panel 1 provided by the above embodiments further includes a plurality of second pixel driving circuits 60 distributed in the second display area AA3. The second pixel driving circuits 60 are configured to drive the third sub-pixels 50. With the above arrangement, the display requirements of the second display area AA3 can be better met. At the same time, the density of the distribution pattern of the first pixel driving circuits 30 in the transitional display area AA2 which is adjacent to the edge of the first display area AA1 can be made similar to the density of the distribution pattern of other regions such as the first display area AA1 and the second display area AA2, so that the display effect of the display panel 1 is optimized.

In some optional embodiments, at least one of the first pixel driving circuit 30 and the second pixel driving circuit 60 may be any one of a 2T1C circuit, a 7T1C circuit, a 7T2C circuit, or a 9T1C circuit. Herein, the "2T1C circuit" refers to a pixel circuit including two transistors (T) and one capacitor (C) therein, and the "7T1C circuit", "7T2C circuit", "9T1C circuit" are formed in a similar manner.

The display panel 1 provided in the embodiments of the present application has the first display area AA1, the second display area AA3 and the transitional display area AA2 located between the first display area AA1 and the second display area AA3. The light transmittance of the first display area AA1 is greater than the light transmittance of the second display area AA3. Therefore, in actual practice, components such as the front camera can be arranged under the first display area AA1, so that not only the full-screen display requirements of the display panel 1 can be satisfied, but also the photosensitive requirements of the components such as the camera can be satisfied due to a higher light transmittance of the first display area AA1.

The display panel 1 includes the first sub-pixels 10 and the blocks 40 located in the first display area AA1 as well as the second sub-pixels 20 and the first pixel driving circuits 30 located in the transitional display area AA2. Therefore, the first sub-pixels 30 located in the first display area AA1 and the second sub-pixels 20 located in the transitional display area AA2 can be driven through the first pixel driving circuits 30, and at the same time, the distribution pattern of the blocks 40 arranged in the first display area AA1 can be made similar to the distribution pattern of the first pixel driving circuits 30 arranged in the transitional display area AA2 through the arrangement of the blocks 40. The uniformity of the distribution pattern of the first pixel driving circuits 30 in the transitional display area AA2 which is adjacent to the first display area AA1 is improved, thereby ensuring the display uniformity of the display panel 1.

Figure 7:
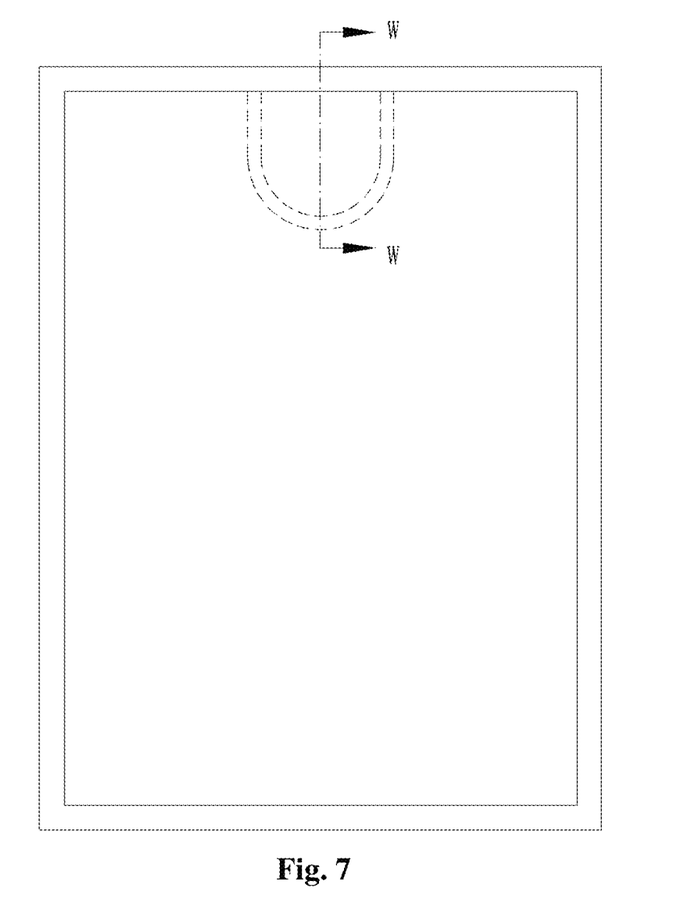
FIG. 7 is a schematic structural diagram of a top view of a display apparatus according to an embodiment of the present application.
Figure 8:
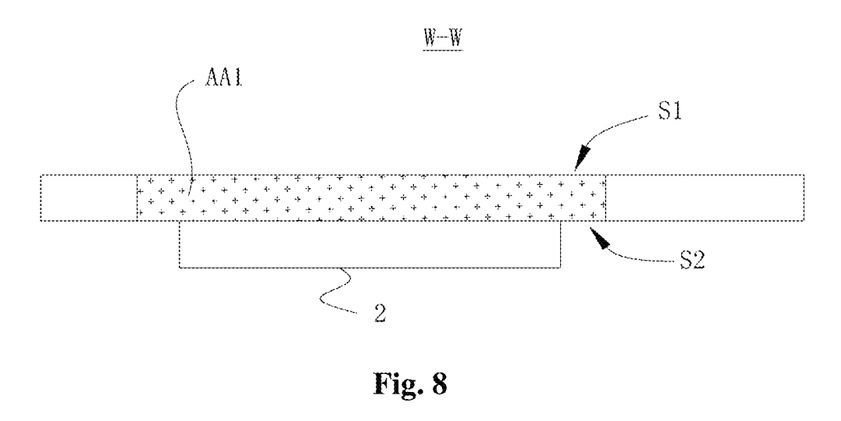
FIG. 8 is a schematic structural diagram of a partial cross-sectional view along the W-W direction in FIG. 7.

In an optional apparatus, the embodiments of the present application further provide a display apparatus including the display panel 1 according to any of the above embodiments. The display panel 1 has the first display area AA1, the transitional display area AA2, and the second display area AA3. The light transmittance of the first display area AA1 is greater than the light transmittance of the second display area AA3. The display panel 1 includes a first surface S1 and a second surface S2 opposite to each other. The first surface S1 is a display surface. The display apparatus further include a photosensitive component 2. The photosensitive component 2 is located on the side of the display panel 1 where the second surface S2 is located. The photosensitive component 2 is corresponding to the position of the first display area AA1.

The photosensitive component 2 may be an image capture apparatus for capturing external image information. In the embodiments, the photosensitive component 2 may be a complementary metal oxide semiconductor (CMOS) image capture apparatus. In some other embodiments, the photosensitive component 2 may be a charge-coupled device (CCD) image capturing apparatus or other form of image capturing apparatus. The photosensitive component 2 may not be limited to an image capturing apparatus. For example, in some embodiments, the photosensitive component 2 may be a light sensor such as an infrared sensor, a proximity sensor, an infrared lens, a flood sensing element, an ambient light sensor, and a dot matrix projector. In addition, in the display apparatus, other components may further be integrated on the second surface of the display panel, such as an earpiece, a speaker, etc.

In the display apparatus according to the present application, the light transmittance of the first display area AA1 is greater than the light transmittance of the second display area AA3, so that in the display panel 100, the photosensitive component 2 can be integrated on the back side of the first display area AA1, achieving the under-screen integration of the photosensitive component 2 such as a camera. At the same time, the first display area AA1 can display images, which increases the display area of the display panel 1 and realizes a full-screen design of the display apparatus.

The display panel 1 includes the first sub-pixels 10 and the blocks 40 located in the first display area AA1 as well as the second sub-pixels 20 and the first pixel driving circuits 30 located in the transitional display area AA2. Therefore, the first sub-pixels 30 located in the first display area AA1 and the second sub-pixels 20 located in the transitional display area AA2 can be driven through the first pixel driving circuits 30, and at the same time, the distribution pattern of the blocks 40 arranged in the first display area AA1 can be made similar to the distribution pattern of the first pixel driving circuits 30 arranged in the transitional display area AA2 through the arrangement of the blocks 40. The uniformity of the distribution pattern of the first pixel driving circuits 30 in the transitional display area AA2 which is adjacent to the first display area AA1 is improved, thereby ensuring the display uniformity of the display apparatus.

Although the present application has been described with reference to the preferred embodiments, various modifications may be made thereto and components thereof may be replaced with equivalents without departing from the scope of the present application. In particular, as long as there is no structural conflict, the technical features mentioned in the embodiments can be combined in any manner. The present application is not limited to the specific embodiments disclosed herein, instead, it includes all technical solutions that fall within the scope of the claims.

What is claimed is:

1. A display panel comprising a first display area, a second display area, and a transitional display area located between the first display area and the second display area, a light transmittance of the first display area being greater than a light transmittance of the second display area, wherein the display panel comprises:
   a plurality of first sub-pixels arranged in the first display area;
   a plurality of second sub-pixels arranged in the transitional display area;
   a plurality of first pixel driving circuits arranged in the transitional display area and configured to drive the plurality of first sub-pixels arranged in the first display area and the plurality of second sub-pixels arranged in the transitional display area;
   a plurality of blocks arranged in the first display area and corresponding to at least a part of the plurality of first sub-pixels arranged in the first display area,
   wherein each of the plurality of first sub-pixels arranged in the first display area adjacent to the plurality of second sub-pixels arranged in the transitional display area corresponds to at least one of the plurality of blocks arranged in the first display area; and
   each of the plurality of first sub-pixels arranged in the first display area comprises a first electrode, a first light-emitting element located on the first electrode and a second electrode located on the first light-emitting element, the first electrode is connected to the first pixel driving circuit arranged in the transitional display area, and in an arrangement direction of the first electrode and the second electrode, an orthographic projection of each of the plurality of blocks arranged in the first display area is completely covered by an orthographic projection of the first electrode.

2. The display panel according to claim 1, wherein the plurality of first pixel driving circuits arranged in the transitional display area are distributed in a first density, the plurality of blocks arranged in the first display area are distributed in a second density, and the first density is greater than or equal to the second density.

3. The display panel according to claim 1, wherein a number of the plurality of blocks arranged in the first display area is equal to a number of the plurality of first sub-pixels arranged in the first display area, and the plurality of blocks arranged in the first display area are arranged in one-to-one correspondence with the plurality of first sub-pixels arranged in the first display area.

4. The display panel according to claim 1, wherein the first electrodes of the plurality of first sub-pixels arranged in the first display area of a same color among the plurality of first sub-pixels are electrically interconnected and are driven by one of the plurality of first pixel driving circuits arranged in the transitional display area.

5. The display panel according to claim 1, wherein each of the plurality of second sub-pixels arranged in the transitional display area comprises a third electrode, a second light-emitting element located on the third electrode and a fourth electrode located on the second light-emitting element, and the third electrode is connected to the first pixel driving circuit arranged in the transitional display area.

6. The display panel according to claim 5, wherein the third electrodes of the plurality of second sub-pixels arranged in the transitional display area of a same color among the plurality of second sub-pixels are electrically interconnected and are driven by one of the plurality of first pixel driving circuits arranged in the transitional display area.

7. The display panel according to claim 1, wherein the plurality of blocks arranged in the first display area and the plurality of first sub-pixels arranged in the first display area are arranged in different layers.

8. The display panel according to claim 1, wherein the plurality of blocks arranged in the first display area are made of a non-conductive material;
the first pixel driving circuit arranged in the transitional display area comprises a semiconductor layer, a first metal layer, a second metal layer, a third metal layer and an interlayer insulating layer; and
the plurality of blocks arranged in the first display area are arranged in a same layer as the interlayer insulating layer, and the plurality of blocks arranged in the first display area comprise hole-shaped slots filled with a material.

9. The display panel according to claim 1, wherein the first pixel driving circuit arranged in the transitional display area comprises a semiconductor layer, a first metal layer, a second metal layer, a third metal layer and an interlayer insulating layer;
wherein the plurality of blocks arranged in the first display area are arranged in a same layer as at least one of the semiconductor layer, the first metal layer, the second metal layer, the third metal layer and the interlayer insulating layer.

10. The display panel according to claim 1, wherein the plurality of blocks arranged in the first display area are transistor structures.

11. The display panel according to claim 1, wherein the display panel further comprises a plurality of third sub-pixels arranged in the second display area, the plurality of third sub-pixels arranged in the second display area are distributed in a third density, the plurality of first sub-pixels arranged in the first display area are distributed in a fourth density, and the third density is greater than the fourth density.

12. The display panel according to claim 11, wherein the display panel further comprises a plurality of second pixel driving circuits arranged in the second display area and configured to drive the plurality of third sub-pixels arranged in the second display area.

13. The display panel according to claim 12, wherein the plurality of first pixel driving circuits arranged in the transitional display area and the plurality of second pixel driving circuits arranged in the second display area are 2T1C circuits, 7T1C circuits, 7T2C circuits, or 9T1C circuits.

14. The display panel according to claim 1, wherein a distribution pattern of the plurality of blocks arranged in the first display area is similar to a distribution pattern of the plurality of first pixel driving circuits arranged in the transitional display area.

15. A display apparatus comprising a display panel according to claim 1.

16. A display panel comprising a first display area, a second display area, and a transitional display area located between the first display area and the second display area, a light transmittance of the first display area being greater than a light transmittance of the second display area, wherein the display panel comprises:
a plurality of first sub-pixels arranged in the first display area;
a plurality of second sub-pixels arranged in the transitional display area;
a plurality of first pixel driving circuits arranged in the transitional display area and configured to drive the plurality of first sub-pixels arranged in the first display area and the plurality of second sub-pixels arranged in the transitional display area;
a plurality of blocks arranged in the first display area and corresponding to at least a part of the plurality of first sub-pixels arranged in the first display area;
wherein the plurality of blocks arranged in the first display area are arranged to be electrically disconnected with the plurality of first sub-pixels arranged in the first display area and the plurality of first pixel driving circuits arranged in the transitional display area, and a distribution pattern of the plurality of blocks arranged in the first display area is similar to a distribution pattern of the plurality of first pixel driving circuits arranged in the transitional display area.

17. The display panel according to claim 16, wherein each of the plurality of first sub-pixels arranged in the first display area comprises a first electrode, a first light-emitting element located on the first electrode and a second electrode located on the first light-emitting element, the first electrode is connected to the first pixel driving circuit arranged in the transitional display area, and in an arrangement direction of the first electrode and the second electrode, an orthographic projection of each of the plurality of blocks arranged in the first display area is completely covered by an orthographic projection of the first electrode.

18. The display panel according to claim 16, wherein the plurality of blocks arranged in the first display area are made of a non-conductive material;
- the first pixel driving circuit arranged in the transitional display area comprises a semiconductor layer, a first metal layer, a second metal layer, a third metal layer and an interlayer insulating layer; and
- the plurality of blocks arranged in the first display area are arranged in a same layer as the interlayer insulating layer; the plurality of blocks arranged in the first display area comprise hole-shaped slots filled with a material.

* * * * *